United States Patent [19]

Nugent et al.

[11] 3,832,653

[45] Aug. 27, 1974

[54] LOW NOISE RF SIGNAL GENERATOR

[75] Inventors: John L. Nugent, Baltimore; Harry W. Claypool, Joppa, both of Md.

[73] Assignee: Westinghouse Electric Corporation, Pittsburgh, Pa.

[22] Filed: Aug. 20, 1973

[21] Appl. No.: 389,610

[52] U.S. Cl. ......... 331/116 R, 331/117 R, 331/164, 331/171

[51] Int. Cl. ............................................ H03b 5/36

[58] Field of Search......... 331/116 R, 117, 164, 171

[56] References Cited

UNITED STATES PATENTS

| | | | |
|---|---|---|---|
| 2,915,708 | 12/1959 | Mohler | 331/116 R |
| 3,495,187 | 2/1970 | Jezierski et al. | 331/116 R |
| 3,569,865 | 3/1971 | Healey | 331/116 R |

*Primary Examiner*—John Kominski
*Attorney, Agent, or Firm*—J. B. Hinson

[57] ABSTRACT

A signal generator for generating a high power low noise RF signal is disclosed. The generator includes a low noise crystal control oscillator for generating a relatively low power, low noise RF signal. The output signal of the oscillator is coupled to a high power RF amplifier which amplifies this signal to generate the low noise high power RF signal. The low frequency noise of the oscillator is reduced by a low frequency negative feedback loop in the oscillator circuit. Noise induced into the oscillator circuit by load changes in the power amplifier is reduced by designing the amplifier such that its input impedance is substantially constant for all phase angles of the RF signal.

The operating frequency of the generator may be changed by switching the crystal which determines the operating frequency of the oscillator. The bandwidth of the oscillator and the amplifier are such that the operating frequency of the oscillator can be changed over a relatively wide range without circuit readjustments.

10 Claims, 1 Drawing Figure

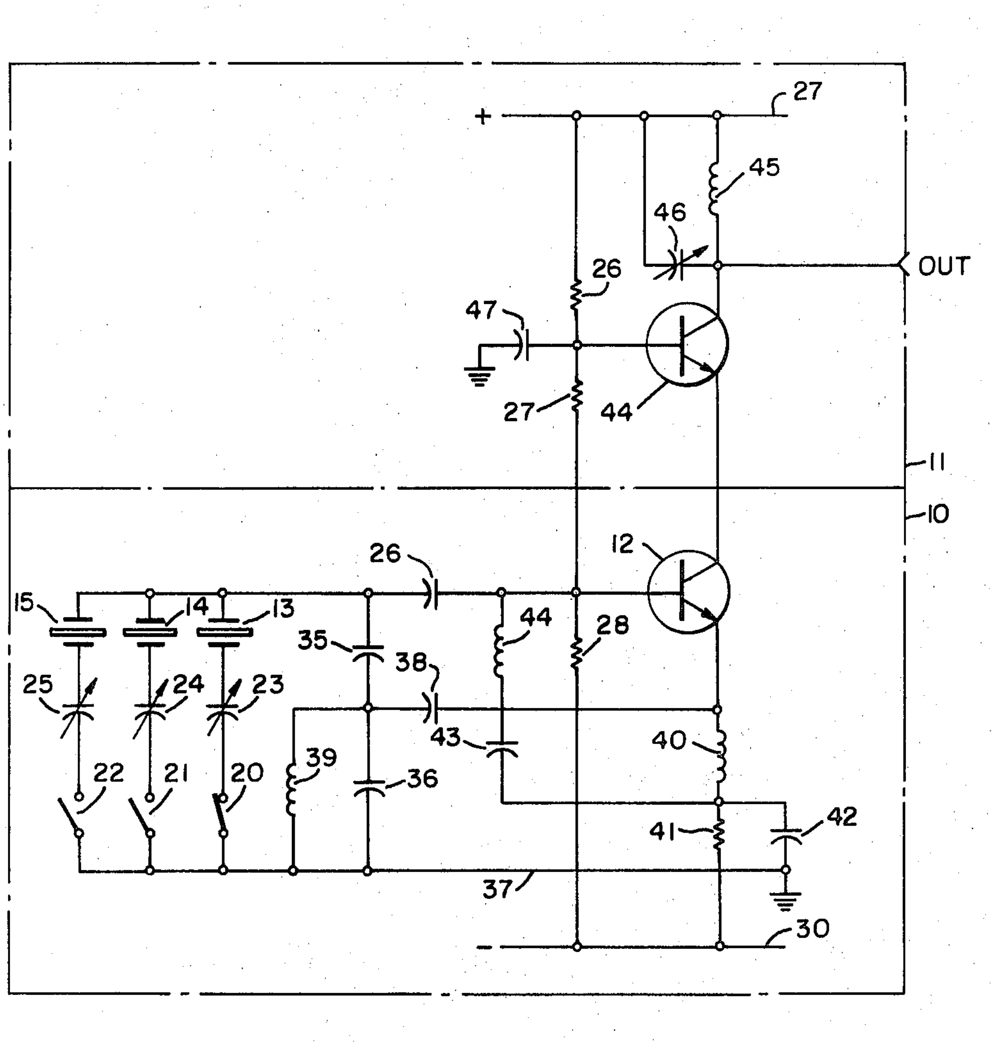
27
+
45
46
OUT
26
47
27
44
11
10
12
26
15
14
13
44
28
35
38
25
24
23
43
40
39
22
21
20
36
42
41
37
30

LOW NOISE RF SIGNAL GENERATOR

BACKGROUND OF THE INVENTION

1. Field of the Invention

The invention relates to RF signal generators and more particularly to low noise high power RF signal generators.

2. Description of the Prior Art

Typical prior art low noise RF signal generators have utilized a low noise, low power oscillator followed by one or more narrow band amplifier circuits. Frequency multiplying circuits were also frequently used to permit the oscillator circuit to operate at a low frequency. While circuits of this configuration are capable of generating relatively low noise signals they are somewhat inconvenient to use in situations where the frequency of the signal generator was frequently changed. This inconvenience was primarily due to the necessity of re-adjusting the narrow band frequency multiplier and amplifying circuits when the frequency was changed.

SUMMARY OF THE INVENTION

The above discussed problems are substantially solved by the disclosed RF signal generator. The disclosed signal generator includes a low noise crystal controlled oscillator for generating a signal at the operating frequency. The output signal of the oscillator is amplified by a low noise amplifier to generate the high power low noise RF output signal. The oscillator circuit includes a negative feedback loop for reducing the low frequency noise of the basic oscillator circuit. The output signal of the oscillator is directly coupled to an amplifier having a low input impedance input. The input impedance of the amplifier is substantially constant for all phase angles of the signal. The bandwidth of the oscillator and amplifier circuits is sufficient to permit the operating frequency to be substantially changed without adjusting the circuits. This assures that the combination of the oscillator and amplifier circuits will generate a signal having low noise and operate over a reasonable frequency range.

The oscillator also includes a plurality of crystals and selection circuitry which selects the crystal to be used to determine the frequency of the oscillator. The crystal switching function may be controlled either locally, that is at the oscillator location, or remotely dependent on the detailed design of the circuit.

DESCRIPTION OF THE DRAWINGS

The sole FIGURE is a schematic diagram of the preferred embodiment of the invention.

DETAILED DESCRIPTION OF THE PREFERRED EMBODIMENT

For purposes of simplifying the description, the RF signal generator has been divided into two functional parts. Basically the RF signal generator comprises an oscillator circuit 10 coupled to a low noise amplifier circuit 11.

The low noise oscillator circuit 10 includes a transistor 12 which provides the power gain necessary to make the oscillator circuit oscillate. The frequency of oscillation is determined by a crystal. In the illustrated and preferred embodiment one of three crystals 13–15 determines the frequency of oscillation dependent on which switch 20–22 is closed. In the illustrated example switch 20 is shown in the closed position causing the frequency of oscillation to be determined by the first crystal illustrated at reference numeral 13.

Each crystals 13–15 is respectively series coupled with an associated capacitor 23–25. The capacitors 23–25 are used as fine tuning adjustments for the frequency of the oscillator. The stray capacitance of the switches 20–22 must be relatively low so that circuit loading caused by the unused crystals does not significantly reduce the Q of the circuit. For oscillators operating in the neighborhood of 100 megacycles, it has been found that the stray capacitance of the switches should be less than 1 picofarad.

The common terminal of the crystals 13–15 is coupled to the base of transistor 12 by a coupling capacitor 26. Bias current to transistor 12 and the transistor 44 utilized in the low distortion amplifier 11, is provided by a resistor network comprising three resistors 26–28. These resistors are connected in series and coupled between the positive and negative voltage supply buses illustrated at reference numerals 29 and 30.

A voltage divider network comprising two capacitors is also coupled between the common junction of the crystals 13–15 and the ground bus 37 of the circuit. Feedback is provided to the junction of these two capacitors from the emitter of transistor 12 by a coupling capacitor 38. Coupling capacitor 38 in conjunction with an inductor 39 form a series resonant circuit between the emitter of transistor 12 and the ground bus 37 of the circuit. This circuit is resonant in the neighborhood of the third overtone frequency of the crystals to suppress this mode of oscillation.

The emitter of transistor 12 is coupled to the negative voltage supply bus 30 by the series combination of a load inductor 40 and a bias resistor 41. The bias resistor 41 in conjunction with the voltage divider network coupled to the base transistor 12 establishes the DC bias current of transistors 12 and 44. The bias resistor 41 is bypassed by a high frequency bypass capacitor 42. The junction of the load inductor 40 and the bias resistor 41 forms a feedback point for a low frequency feedback circuit comprising a series coupled capacitor and inductor respectively illustrated at reference numerals 43 and 44. This circuit provides negative feedback at low frequency thereby reducing the low frequency noise of the oscillator circuit 10.

The output signal of the oscillator 10 is available at the collector of transistor 12. The collector of the oscillator transistor 12 is coupled directly to the emitter of the amplifier transistor 44. The collector of transistor 44 is coupled to the positive power supply bus 29 of the circuit by a parallel LC circuit comprising an inductor and capacitor 45 and 46. This circuit is relatively broad band and is adjusted to be resonant at the middle of the frequency band to be covered by the circuit. The base terminal of the transistor used in the amplifier circuit 11 is bypassed to ground by a bypass capacitor 47. This causes the base of this transistor to be at approximately ground potential as far as AC is concerned causing the amplifier circuit 12 to operate as a grounded base amplifier.

The input impedance to the amplifier 11 is relatively low and substantially constant for all phase angles of the RF signal generated by the oscillator circuit 10. This substantially reduces the phase noise of the RF output signal.

The crystal selections switches 20–22 may be simple manually operated switches, relays or any other type of switching devices having the requisite low capacitance. They may also be operated locally that is at the site of the oscillator or remotely depending on the detail requirements of the application. The bandwidth of the system also depends to some extent on the detail design of the circuit however it has been found that in the neighborhood of 100 megacycles bandwidths in the neighborhood of 20 percent of the mid-range frequency can be achieved without readjustment of the circuit of substantial degradation of the power output or noise levels.

We claim:

1. A low noise RF signal generator comprising:

a low noise oscillator which includes a transistor having its base coupled to the ground terminal of the oscillator through a frequency determining circuit and its emitter coupled to ground through an R.F. impedance, a high frequency feedback circuit from the emitter terminal of said transistor to said frequency determining circuit to assure that said low noise oscillator oscillates at the proper frequency, and a low frequency feedback circuit from the emitter circuit of said transistor to the base of said transistor to reduce the low frequency noise of said oscillator; and a low noise amplifier coupled to the output of said oscillator.

2. A low noise RF signal generator in accordance with claim 1 wherein said frequency determining circuit includes a plurality of crystals with one terminal of each of said crystals being connected in common with each other and to the base of said transistor, the second terminal of each of said crystals being coupled to the ground terminal of said oscillator through a switching device for selecting which one of said plurality of crystals will be utilized to determine the frequency of said RF signal.

3. An RF signal generator in accordance with claim 2 wherein said low noise amplifier includes input and output circuitry having a bandwidth equal to at least 20 percent of the mid-range frequency of the generator.

4. An RF signal generator in accordance with claim 3 wherein said input circuit comprises the input circuitry of a grounded base transistor circuit.

5. An RF signal generator in accordance with claim 1 wherein said low frequency feedback circuit includes a capacitor and an inductor connected in series, said low frequency feedback circuit being coupled between the emitter circuit and the base terminal of said transistor.

6. An RF signal generator in accordance with claim 2 further including a variable capacitor coupled in series with each of said crystals and its associated switching device.

7. An RF generator in accordance with claim 2 wherein said low noise amplifier includes a transistor operating in the grounded base mode.

8. An RF signal generator in accordance with claim 7 wherein the said low noise amplifier is coupled to said low noise oscillator by coupling the collector of the transistor included in said oscillator circuit directly to the emitter of the transistor included in said low noise amplifier circuit.

9. An RF signal generator in accordance with claim 3 wherein said output circuit comprise a parallel LC circuit with the capacitor being variable to permit tuning of the circuit.

10. A low noise RF generator in accordance with claim 1 wherein said frequency determining circuit includes a capacitor divider network, said network providing a feedback point for coupling a feedback signal from the emitter of said transistor to said frequency determining circuit.

* * * * *